United States Patent [19]

Izumi et al.

[11] Patent Number: 5,274,570
[45] Date of Patent: Dec. 28, 1993

[54] INTEGRATED CIRCUIT HAVING METAL SUBSTRATE

[75] Inventors: Tomoji Izumi, Hatsukaichi; Yuichi Itoh; Nagahisa Fujita, both of Hiroshima, all of Japan

[73] Assignee: Mazda Motor Corporation, Hiroshima, Japan

[21] Appl. No.: 47,387

[22] Filed: Apr. 16, 1993

Related U.S. Application Data

[63] Continuation of Ser. No. 524,379, May 17, 1990, abandoned.

[30] Foreign Application Priority Data

May 22, 1989 [JP] Japan ................ 1-126717

[51] Int. Cl.⁵ ............................................. H05K 1/16
[52] U.S. Cl. .................... 364/490; 364/489; 361/684; 361/764
[58] Field of Search ............... 364/488, 489, 490, 578, 364/431.04, 431.12; 361/331, 380, 392, 395, 399, 400, 401, 403, 404

[56] References Cited

U.S. PATENT DOCUMENTS

| | | | |
|---|---|---|---|
| 4,084,240 | 4/1978 | Lappington | 364/431.04 |
| 4,677,558 | 6/1987 | Böhmler et al. | 364/431.04 |
| 4,710,797 | 12/1987 | Tanaka | 361/401 |
| 4,730,256 | 3/1988 | Niimi et al. | 364/431.12 |
| 4,853,850 | 8/1989 | Krass, Jr. et al. | 364/200 |
| 4,858,071 | 8/1989 | Manabe et al. | |
| 4,901,259 | 2/1990 | Watkins | 364/578 |
| 5,014,161 | 5/1991 | Lee et al. | 361/403 |
| 5,042,145 | 8/1991 | Boucquet | 361/401 |
| 5,216,806 | 6/1993 | Lam | 361/404 |

FOREIGN PATENT DOCUMENTS

| | | |
|---|---|---|
| 0155403 | 12/1984 | European Pat. Off. |
| P4016532.9-34 | 1/1992 | Fed. Rep. of Germany |
| 46-13234 | 4/1971 | Japan |
| 63-131146 | 8/1988 | Japan |

OTHER PUBLICATIONS

European Search Report citing 4 prior art references (attached), completed on Jan. 29, 1990 by Examiner F. M. A. Toussaint in The Hague.

English Abstract of Japanese Patent Publication No. 46-13234–one page.

Huse, Horst: Multi-Mikrocomputer-System modular aufgebaut, *Multi-Prozessor-Systeme*, pub. by Franzis Verlag 1982, p. 60.

German Patent Office Action dated May 4, 1993 (with English translation).

*Primary Examiner*—Vincent N. Trans

[57] ABSTRACT

An integrated circuit of this application includes a circuit board in which a conductive layer of a desired pattern is formed on a metal substrate through an insulating layer, a circuit element mounted on the insulating layer, and first and second connectors for connecting at least the circuit element and an external device. The circuit element is nondetachably mounted on the insulating layer, and has a nonvolatile content which can be rewritten by an external operation. The first connector connects at least the circuit element to a portion to be controlled, and the second connector connects the circuit element and an external processing device via a path different from that of the first connector so as to process a storage content of the circuit element.

13 Claims, 10 Drawing Sheets

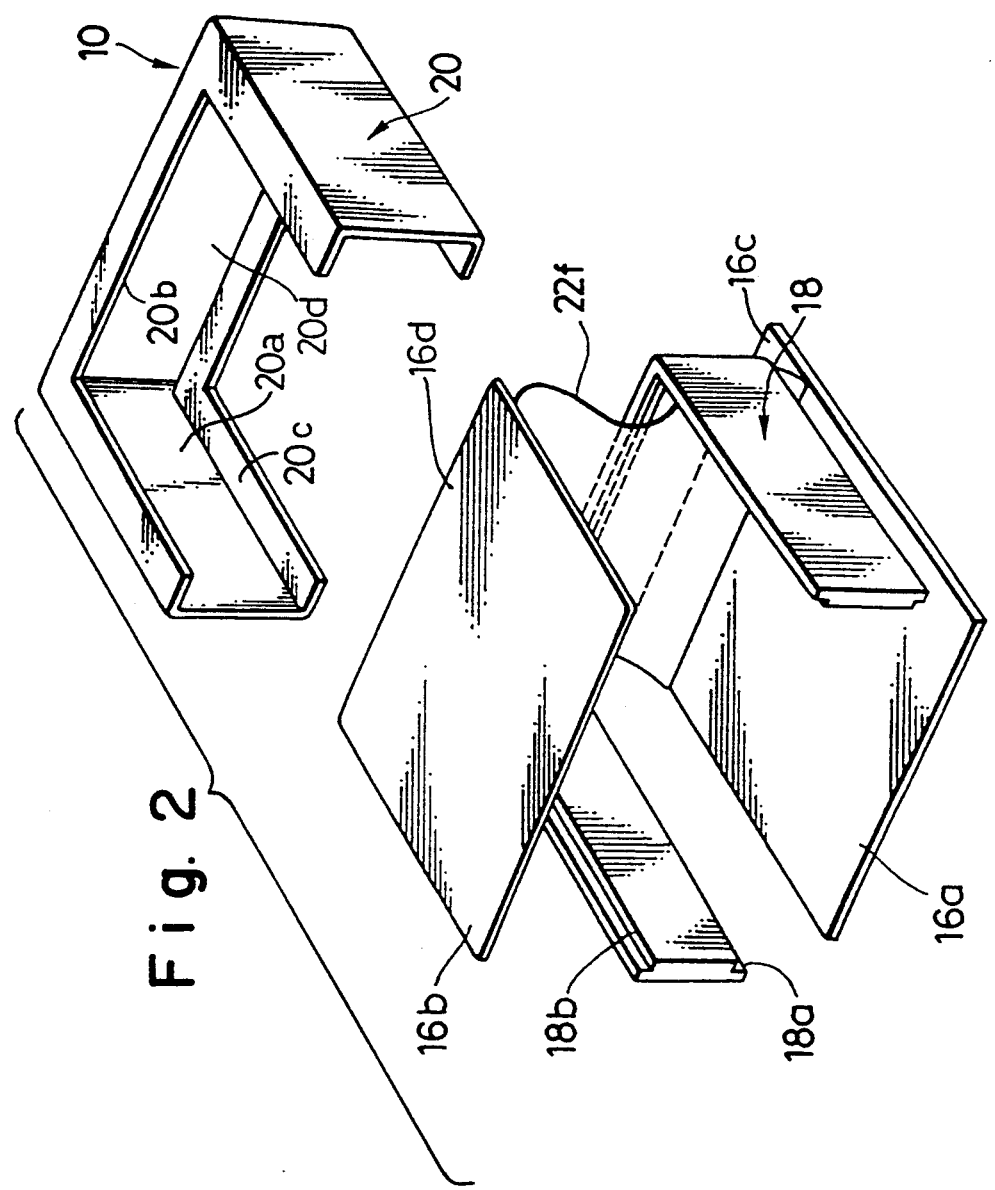

INTEGRATED CIRCUIT HAVING METAL SUBSTRATE

This application is a continuation of application Ser. No. 07/524,379, filed May 17, 1990, now abandoned.

BACKGROUND OF THE INVENTION

The present invention relates to an integrated circuit comprising a circuit board in which a conductive layer having a desired pattern is formed on a metal substrate through an insulating layer, and a circuit element nondetachably mounted on the insulating layer and having a nonvolatile storage content which can be rewritten by an external operation.

Conventionally, a technique disclosed in Japanese Patent Publication No. 63-131146 is known as an integrated circuit having a pair of metal substrates, wherein conductive layers are adhered to each metal substrate through an insulating layer, a circuit element is fixed to each conductive layer, and the conductive layers are connected through a connecting substrate, and are separated from each other to face each other. In addition, a method of manufacturing the integrated circuit is disclosed in Japanese Patent Publication No. 46-13234 and comprises the step of anode-oxidizing at least one major surface of an aluminum substrate to form a thin aluminum oxide layer on the substrate surface, the step of selectively bonding and forming a resistive material and a high-conductivity material on the thin aluminum oxide film to form a plurality of circuit elements, the step of fixing transistor pellets on lead portions formed by selectively bonding the high-conductivity material, and the step of sealing at least all the circuit elements.

In the integrated circuit formed in this manner of Japanese Patent Application No. 46-13234, on a circuit board in which a conductive layer of a desired pattern is formed on a metal substrate through an insulating layer, at least one memory element is nondetachably mounted as a so-called bare chip on the insulating layer.

The integrated circuit formed in this manner may be employed in a vehicle in view of its compact structure and low cost. However, when the integrated circuit having a metal substrate is actually used in a vehicle, various tests must be conducted in a development process, so that data stored in the memory element must be rewritten as needed, and a control program must be updated.

However, the memory element is directly mounted on a circuit as a bare chip. When the memory element is once mounted, it cannot be detached. Thus, it is difficult to perform processing of a storage content, for example, it is difficult to rewrite data, update a control program, monitor a storage content, and the like. As a result, a degree of freedom in development is considerably restricted.

SUMMARY OF THE INVENTION

The present invention has been made in consideration of the above situation, and has as its principal object to provide an integrated circuit having a metal substrate, which can externally perform processing of a storage content of a memory element, e.g., rewriting of data and updating of a control program, in a development process of the integrated circuit, thereby improving a degree of freedom in development.

It is another object of the present invention to provide an integrated circuit having a metal substrate which can externally monitor a storage content of a memory element, thereby improving a degree of freedom in development.

It is still another object of the present invention to provide an integrated circuit having a metal substrate, which can externally perform processing of a storage content of a memory element such as rewriting of data and updating of a control program, and can externally monitor the storage content without disassembling an assembled structure.

It is still another object of the present invention to provide an integrated circuit having a metal substrate, which can externally perform processing of a storage content of a memory element such as rewriting of data and updating of a control program to update its performance after the integrated circuit is mounted in a vehicle.

In order to achieve the above objects, according to the present invention, there is provided an integrated circuit having a metal substrate, which comprises a circuit board in which a conductive layer of a desired pattern is formed on the metal substrate through an insulating layer, a circuit element nondetachably mounted on the insulating layer and having a nonvolatile storage content which can be rewritten by an external operation, first connector means for connecting at least the circuit element and an external device, and second connector means for connecting the circuit element and an external processing device via a path different from that of the first connector means so as to process the storage content of the circuit element.

In the integrated circuit having the metal substrate according to the present invention, the conductive layer constitutes or includes a first signal line group for connecting the circuit element to another circuit element, and a second signal line group for connecting the circuit element to the second connector means, and signal shut-off means which is operated to shut off data transmission to the another circuit element when the storage content of the circuit element is to be written is arranged at a position on the first signal line group and adjacent to the circuit element.

In the integrated circuit having the metal substrate according to the present invention, the second connector means is filled with a resin to be sealed from an external portion when development of the circuit element is finished.

In the integrated circuit having the metal substrate according to the present invention, the second connector means is mounted on a portion to be mounted so as to be able to be connected to the external processing device.

In the integrated circuit having the metal substrate according to the present invention, the circuit element connected to the external processing device through the second connector means comprises a memory element storing predetermined data, and the external processing device comprises a tuning device for rewriting or monitoring the storage content of the memory element.

In the integrated circuit having the metal substrate according to the present invention, the circuit element connected to the external processing device through the second connector means comprises a CPU having a predetermined control program, and the external processing device comprises a tuning device for rewriting a control content of the CPU or an emulator for emulating the control content of the CPU.

In the integrated circuit having the metal substrate according to the present invention, the first connector means comprises a first male connector integrally mounted on one end of the integrated circuit, and a first female connector detachably attached to the first male connector, and connected to the portion to be controlled, and the second connector means comprises a second female connector integrally mounted on the other end of the integrated circuit, and a second male connector detachably attached to the second female connector, and connected to the external processing device.

In the integrated circuit having the metal substrate with the above arrangement, upon processing of a storage content, e.g., rewriting of data, updating of a control program, and monitoring of data, in a development process, a circuit element which covers these operations is connected to an external processing apparatus through the special-purpose second connector means in a nondetachably mounted state, so that the processing of the storage content such as rewriting of data and updating of the control program can be externally performed by the external processing apparatus, thereby improving a degree of freedom in development.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 2 is an exploded perspective view showing an arrangement of the integrated circuit shown in FIG. 1;

DETAILED DESCRIPTION OF THE PREFERRED EMBODIMENTS

An embodiment of an integrated circuit having a metal substrate according to the present invention will be described in detail below with reference to FIGS. 1 to 11. In this case, the present invention is applied to a case-like hybrid integrated circuit.

Figure 1:
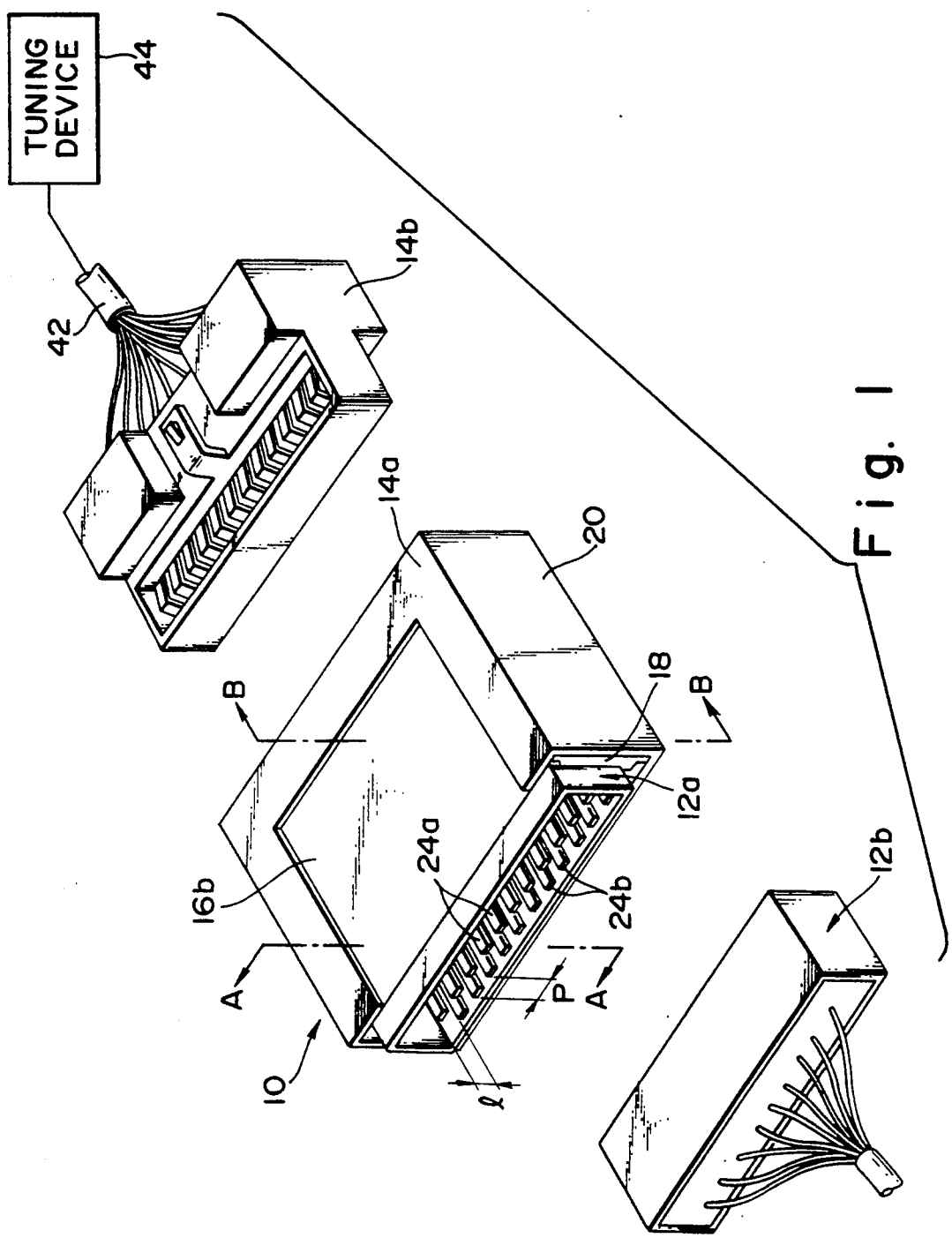
FIG. 1 is a perspective view showing an embodiment of an integrated circuit having a metal substrate according to the present invention.

FIG. 1 shows a hybrid integrated circuit 10 of this embodiment. The hybrid integrated circuit 10 is arranged as a control unit as a vehicle functional component. More specifically, the integrated circuit 10 is arranged as an integrated circuit independently having a function of an engine control unit.

As shown in FIG. 1, the hybrid integrated circuit 10 is formed as a box-like case, whose interior is closed. The hybrid integrated circuit 10 can be connected to first and second connector mechanisms 12 and 14 at its opposing one and the other end portions, respectively. More specifically, the first connector mechanism 12 is used to connect the integrated circuit 10 to a vehicle harness (not shown), and comprises a first male connector 12a integrally formed on one end (rear end) of the integrated circuit 10, and a first female connector 12b detachably connected to the first male connector 12a. The second connector mechanism 14 is used to connect the integrated circuit 10 to an external processing apparatus for processing a storage content of a memory element mounted in advance on the integrated circuit 10 and for monitoring the storage content, and comprises a second female connector 14a integrally formed on the other end (front end) of the integrated circuit 10, and a second male connector 14b detachably connected to the second female connector 14a.

The first male connector 12a is connected to the conventional first female connector 12b, as will be described in detail below. The second female connector 14a is connected to the conventional second male connector 14b.

Figure 3A:
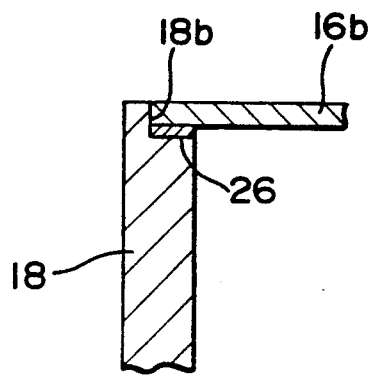
FIG. 3A is a sectional view taken along a line A—A in FIG. 1.
Figure 3B:
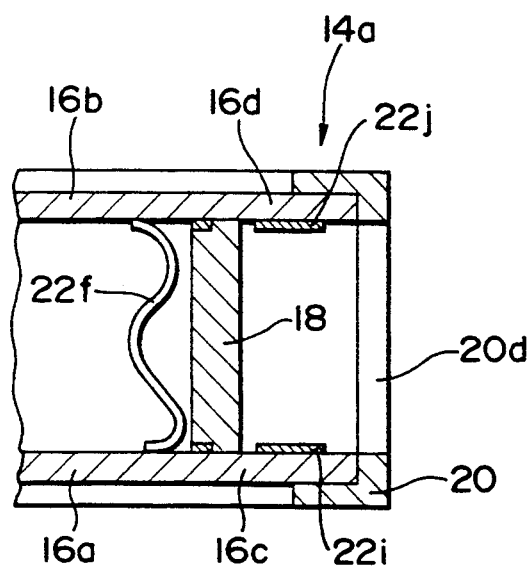
FIG. 3B is a sectional view taken along a line B—B in FIG. 1.

As shown in FIGS. 2 to 3B, the hybrid integrated circuit 10 comprises a pair of first and second circuit boards 16a and 16b which are vertically separated from each other, a side plate 18 for separating the first and second circuit boards 16a and 16b at a predetermined distance and closing the side surfaces, and a frame 20 for integrally fixing the first and second circuit boards 16a and 16b and the side plate 18.

Circuit elements such as IC chips, a memory element, resistors, capacitors, and the like necessary for providing the function of the engine control unit are mounted on the first and second circuit boards 16a and 16b. More specifically, so-called logic circuit elements are connected to the lower first circuit board 16a, and so-called power circuit elements are connected to the upper second circuit board 16b.

Note that a mounting state of the circuit elements on the first circuit board 16a corresponds to the gist of the present invention, and will be described in detail later.

Figure 4A:
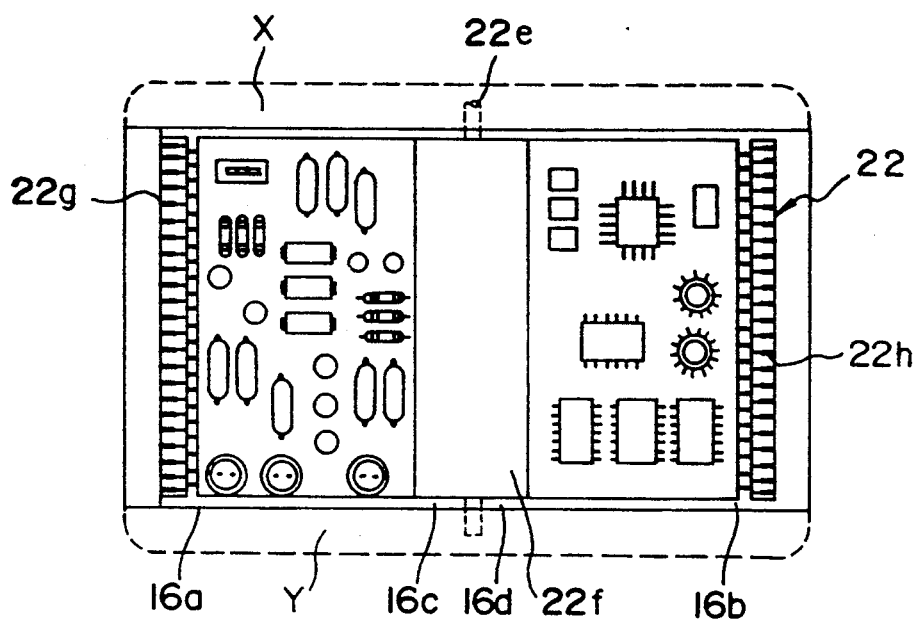
FIG. 4A is a plan view showing an arrangement of a common circuit board.
Figure 4B:
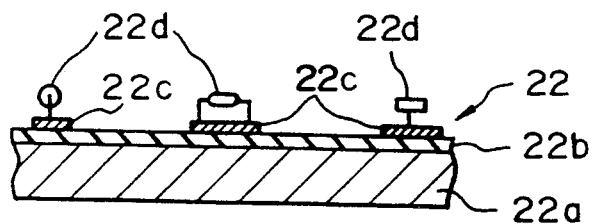
FIG. 4B is a sectional view showing the arrangement of the common circuit board.

As shown in FIG. 4A, the first and second circuit boards 16a and 16b are formed by splitting a single common circuit board 22. More specifically, as shown in FIG. 4B, the common circuit board 22 is formed by a circuit board body 22a formed of a conductive material such as aluminum, an insulating layer 22b adhered on the entire upper surface of the circuit board body 22a, conductive layers 22c formed on the insulating layer 22b to have a predetermined circuit pattern and to define a circuit network, and circuit elements 22d fixed on and electrically connected to the conductive layers 22c.

A vertically extending opening portion 22e is performed at the central portion of the common circuit board 22, as shown in FIG. 4A. The circuit networks on the left and right portions of the opening portion 22e are connected to each other through a flexible circuit board 22f arranged over the opening portion 22e. Note that the end portion adjacent to the flexible circuit board 22f is connected at a position which enters inwardly from the corresponding side edge of the opening portion 22e by a predetermined distance. More specifically, projections 16c and 16d are defined on the other end portions of the two circuit boards 16a and 16b within a range of this predetermined distance. By cutting off upper and lower edges (regions indicated by reference symbols X and Y) including the upper and lower ends of the opening portion 22e, the pair of circuit boards 16a and 16b are formed while being connected through the flexible circuit board 22f.

In the common circuit board 22, a plurality of first connecting terminals 22g and 22h are formed in lines along edges on the upper surfaces of portions corresponding to outer edge portions of the circuit boards 16a and 16b, i.e., on the opposing inner surfaces of the edge portions defining one end of the case in a state wherein the opposing circuit boards 16a and 16b are vertically separated from each other to face each other. Connecting pins 24a and 24b of the first male connector 12a (to be described later) are fixed and electrically connected to these first connecting terminals 22g and 22h to project outwardly.

A plurality of second connecting terminals 22i and 22j (shown in FIG. 5) are formed in lines along edges on opposing portions of upper and lower end portions for defining the other end of the case, i.e., opposing inner surfaces of the projections 16c and 16d while the two circuit boards 16a and 16b are vertically separated from each other. These second connecting terminals 22i and 22j constitute connecting terminals of the second female connector 14a (to be described later).

As shown in FIG. 2, the side plate 18 described above is formed to have a U-shaped shape having one open side when viewed from the above. The open side portion serves as one end of the case. Stepped portions 18a and 18b for receiving three edge portions of each of the circuit boards 16a and 16b are formed at inner side edges of the upper and lower end faces of the side plate 18.

As shown in FIG. 3A, the circuit boards 16a and 16b are fitted in the corresponding stepped portions 18a and 18b through seal rubber members 26. Since the seal rubber members 26 are inserted, dust or the like can be prevented from entering the case from gaps between the circuit boards and the stepped portions.

A portion of the side plate 18 which closes the other end portion of the integrated circuit 10 is set to be just located at a boundary portion between the projections 16c and 16d and the circuit boards 16a and 16b, as shown in FIG. 3B. As a result, a housing of the second male connector 12b is defined by a projecting portion located outside the side plate 18.

The frame 20 is formed of a synthetic resin as an insulating member. The frame 20 is formed to surround the side surfaces closed by the side plate 18 while vertically clamping it, as shown in FIG. 2. More specifically, the frame 20 consists of an integral body of a main body 20a opposing the side plate 18, and flange portions 20b and 20c extending inwardly from the upper and lower ends of the main body 20 by a predetermined distance (more specifically, by a distance large enough to clamp three non-open edge portions of the circuit boards 16a and 16b).

Note that an opening 20d is entirely formed in a of the main body 20a of the frame 20, which defines the other end face (front end face) of the integrated circuit 10, so as to allow connection of the second female connector 14a described above to the second male connector 14b.

As shown in FIG. 3B, the frame 20 vertically clamps the upper and lower second and first circuit boards 16b and 16a respectively fitted in the upper and lower stepped portions 18b and 18a of the side plate 18, thereby integrally constituting the case. As shown in FIG. 3B, the flexible circuit board 22f for connecting circuit elements 22d of the upper and lower second and first circuit boards 16b and 16a is located slightly inwardly from the other end portion of the side plate 18.

Since the frame 20 is formed in this manner, the first and second circuit boards 16a and 16b can maintain an assembled state while being vertically separated at a predetermined distance in a state wherein the side plate 18 is interposed therebetween.

In this embodiment, the hybrid integrated circuit 10 is formed into a case-like shape, and the upper and lower surfaces of the case are directly defined by the circuit boards 16b and 16a. As a result, a compact, light-weight structure can be realized as compared to a case wherein the first and second circuit boards 16a and 16b are housed in a separate case.

The arrangement of the connecting device for connecting the case-like hybrid integrated circuit 10 with the above arrangement to portions to be controlled of the vehicle through a vehicle harness will be described below with reference to FIGS. 5 to 8.

Figure 5:
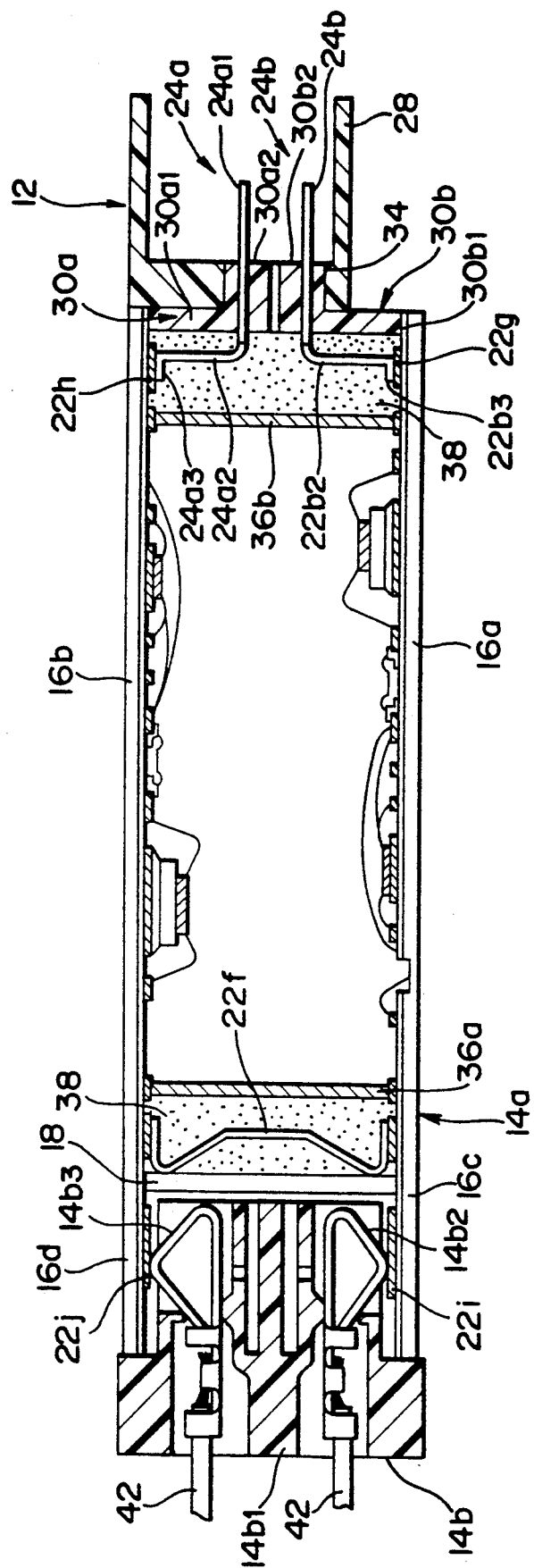
FIG. 5 is a sectional view showing an arrangement of a male connector mounted on the integrated circuit.
Figure 6:
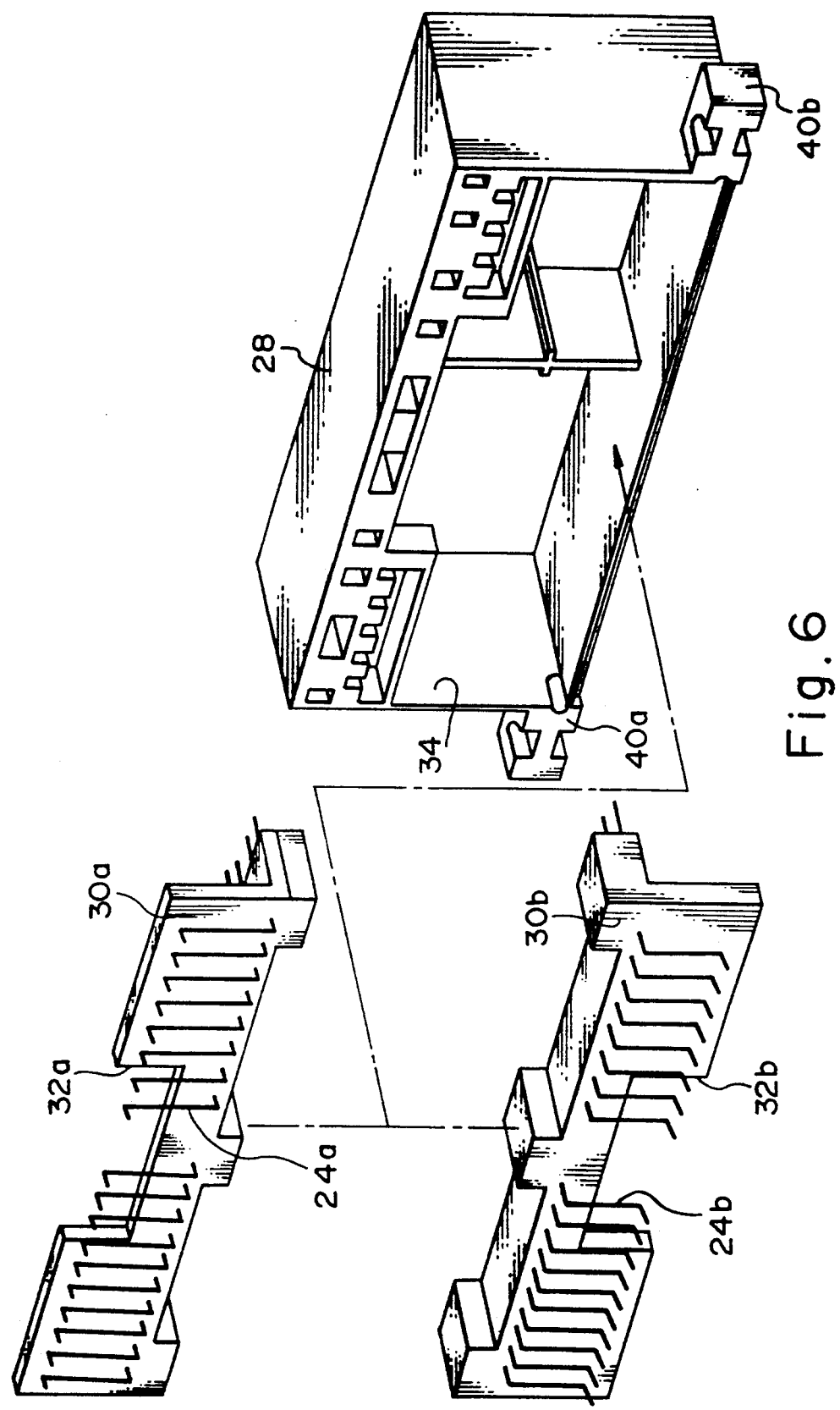
FIG. 6 is an exploded perspective view showing in detail the arrangement of the male connector.

The connecting device comprises the first male connector 12a mounted on one opening portion of the case-like hybrid integrated circuit 10 in a so-called internal mounting state, and the first female connector 12b detachably connected to the first male connector 12a. As shown in FIG. 5, the first male connector 12a has a so-called 3-piece structure, i.e., comprises a connector housing 28 formed into a box-like housing having open front and rear surfaces, an upper connecting pin support member 30a on which the upper connecting pins 24a are disposed to be laterally aligned in line, and a lower connecting pin support member 30b on which the lower connecting pins 24b are disposed to be laterally aligned in line.

The upper and lower connecting pin support members 30a and 30b are formed vertically symmetrically about the vertically central portion. The upper connecting pin support member 30a is integrally formed substantially into an L shape by an upright segment $30a_1$, and a projection $30a_2$ projecting outwardly from the lower end of the upright segment $30a_1$. The lower connecting pin support member 30b is integrally formed substantially into an inverted-L shape by an upright segment $30b_1$, and a projection $30b_2$ projecting outwardly from the upper end of the upright segment $30b_1$.

Each upper connecting pin 24a is integrally formed by a horizontal portion $24a_1$ which horizontally extends through the projection $30a_2$ to project in the back-and-forth direction, a vertical portion $24a_2$ which extends vertically upward from the inner edge of the horizontal portion $24a_1$ along the inner surface of the upright segment $30a_1$, and a bent portion $24a_3$ which is inwardly bent from the upper end of the vertical portion $24a_2$. The bent portion $24a_3$ is defined as a connecting portion connected to the corresponding connecting terminal 22h formed on the upper second circuit board 16b by soldering. The outward projecting portion of the horizontal portion 24$a_1$ is defined as a connecting portion inserted in and connected to the female connector 14.

Each lower connecting pin 24$b$ is integrally formed by a horizontal portion 24$b_1$ which horizontally extends through the projection 30$b_2$ to project in the back-and-forth direction, a vertical portion 24$b_2$ which extends vertically downward from the inner edge of the horizontal portion 24$b_1$ along the inner surface of the upright segment 30$b_1$, and a bent portion 24$b_3$ which is inwardly bent from the lower end of the vertical portion 24$b_2$. The bent portion 24$b_3$ is defined as a connecting portion connected to the corresponding connecting terminal 22$g$ formed on the lower first circuit board 16$a$ by soldering. The outward projecting portion of the horizontal portion 24$b_1$ is defined as a connecting portion inserted in and connected to the female connector 14.

The connecting pin support members 30$a$ and 30$b$ have sizes large enough to be just fitted in the one-end opening portion of the case-like hybrid integrated circuit 10 in a state wherein they are coupled vertically. In other words, a range of the two upright segments 30$a_1$ and 30$b_1$ (i.e., an outer periphery) of the vertically coupled support members 30$a$ and 30$b$ just defines the inner periphery of the one-end portion of the integrated circuit 10.

Recesses 32$a$ and 32$b$ are respectively formed at the central portions of the upper and lower edges of the connecting pin support members 30$a$ and 30$b$. These recesses 32$a$ and 32$b$ define an injection hole of an epoxy resin which is injected after the first male connector 12$a$ is integrally assembled with the hybrid integrated circuit 10, as will be described later.

The upper and lower connecting pins 24$a$ and 24$b$ have vertically symmetrical shapes, i.e., have the same shape, and the upper and lower connecting pin support members 30$a$ and 30$b$ also have the vertically symmetrical shapes, i.e., the same shape. In this manner, since the connecting pin support members 30$a$ and 30$b$ on which the connecting pins 24$a$ and 24$b$ are mounted have the same shape, components can be commonly used, thus reducing cost.

Figure 7:
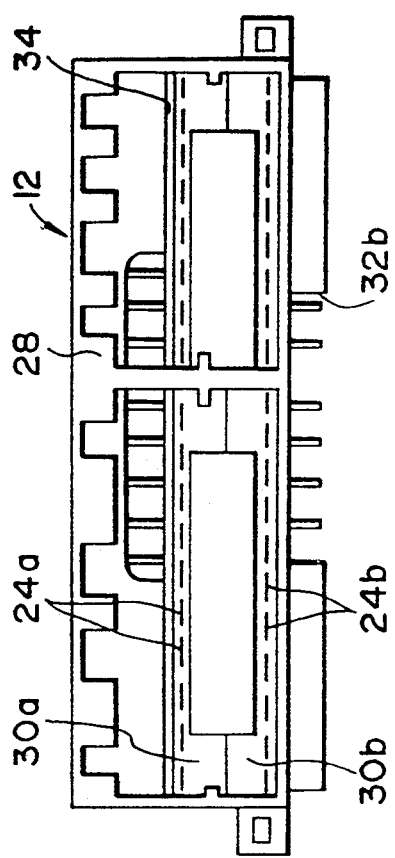
FIG. 7 is a front view showing an assembled state of the male connector.

The connector housing 28 described above has a fitting hole 34 which extends in the back-and-forth direction. The fitting hole 34 has a size large enough to receive the stacked projections 30$a_2$ and 30$b_2$ while the upper and lower connecting pin support members 30$a$ and 30$b$ are coupled, as shown in FIG. 7.

Mounting flanges 40$a$ and 40$b$ are formed integrally on two side portions of the connector housing 28.

These flange portions 40$a$ and 40$b$ are fixed to a vehicle body (not shown) after the first male connector 12$a$ is mounted on and fixed to the hybrid integrated circuit 10. In this manner, a flange portion for mounting the hybrid integrated circuit 10 need not be provided to the hybrid integrated circuit 10 itself, resulting in the simple hybrid integrated circuit 10.

In this embodiment, a vertical interval and a horizontal pitch p of the connecting pins 24$a$ and 24$b$ are defined on the basis of the conventional pin alignment specifications. As a result, the first female connector 12$b$ connected to the first male connector 12$a$ can employ a conventional one, thus providing economic advantages.

A conventional male connector is not employed since it is heavy and large in size. Instead, the special first male connector 12$a$ is formed in correspondence with the compact, light-weight case-like hybrid integrated circuit 10. Therefore, according to this embodiment, the compact, light-weight structure of the hybrid integrated circuit 10 can be assured.

Figure 8:
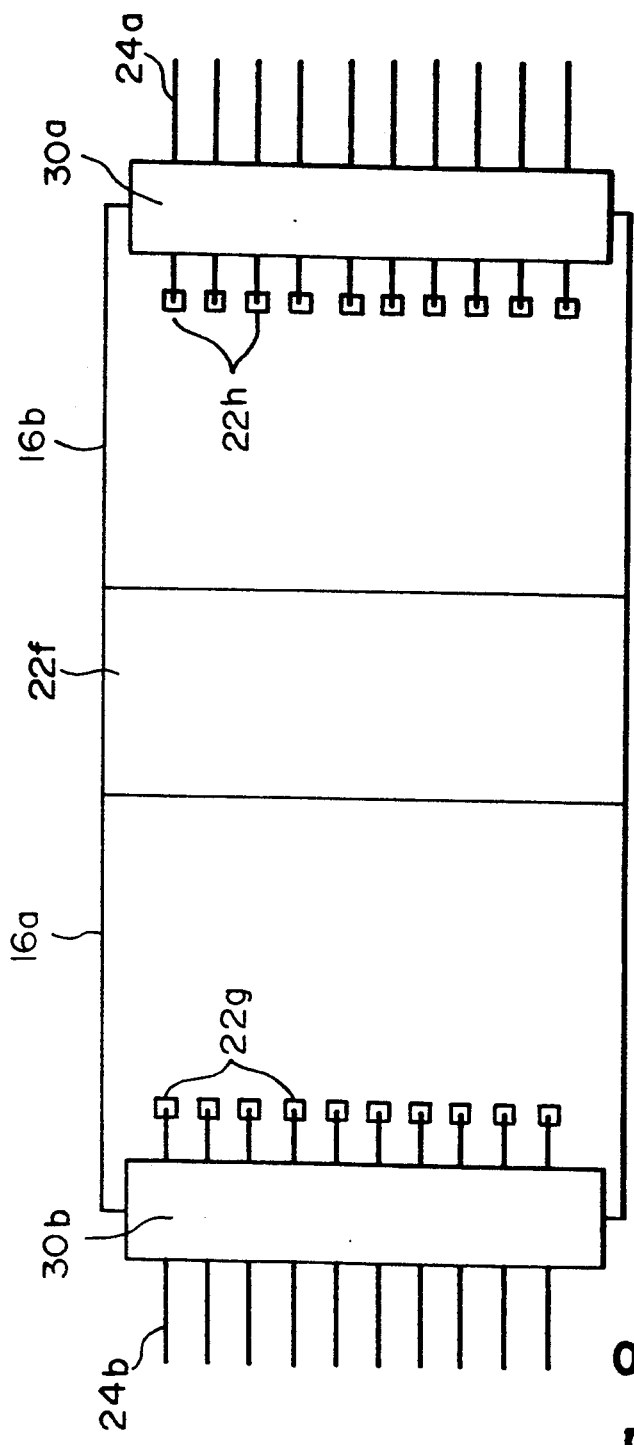
FIG. 8 is a plan view showing a state wherein connecting pin support members are fixed to a circuit board in an open state.

An assembly operation of the first male connector 12$a$ whose assembled state is shown in FIG. 5, and an assembly operation of the hybrid integrated circuit 10 will be described below with reference to FIG. 8.

As has been described above with reference to FIGS. 4A and 4B, the upper and lower edges X and Y are cut from the common circuit board 22 on which the predetermined circuit elements 22$d$ are mounted, so that the first and second circuit boards 16$a$ and 16$b$ are formed in an open state on the same plane. As shown in FIG. 8, the corresponding pin support members 30$a$ and 30$b$ are fixed to the first and second circuit boards 16$a$ and 16$b$ in the open state by an adhesive.

As described above, the corresponding connecting pins 24$a$ and 24$b$ have already been mounted on these connecting pins support members 30$a$ and 30$b$. In this manner, these connecting pins 24$a$ and 24$b$ are soldered to the corresponding connecting terminals 22$g$ and 22$h$ of the first and second circuit boards 16$a$ and 16$b$ in the open state. In particular, a precise soldering operation is required since the number of connecting terminals 22$g$ and 22$h$ is large. In this embodiment, however, since the first and second circuit boards 16$a$ and 16$b$ are set in the open state on the same plane, the soldering operation can be reliably executed, thus improving workability and assuring easy assembly.

Thereafter, the second circuit board 16$b$ is lifted while the first circuit board 16$a$ is held in position, and is moved to a position above and parallel to the lower first circuit board 16$a$. As shown in FIG. 8, the connecting pin support members 30$a$ and 30$b$ are then coupled vertically. When the connecting pin support members 30$a$ and 30$b$ are vertically coupled in this manner, the first and second circuit boards 16$a$ and 16$b$ are held to be parallel to each other.

Prior to the coupling operation, frame members 36$a$ and 36$b$ for keeping a predetermined interval between the first and second circuit boards 16$a$ and 16$b$, and shielding an internal space from the outside while reinforcing the mechanical strength of the hybrid integrated circuit 10 are mounted in an upright state on the front and rear portions of the lower first circuit board 16$a$, as shown in FIG. 5. One frame member 36$a$ is located slightly inwardly from the flexible circuit board 22$f$. The other frame member 36$b$ is located slightly inwardly from the connecting terminals 22$g$ and 22$h$.

The assembly is fitted in the fitting hole 34 of the connector housing 28 while maintaining the coupled state of the members 30$a$ and 30$b$. In the fitting state, the first male connector 12$a$ is integrally mounted on the hybrid integrated circuit 10. Thereafter, as described above, the side plate 18 is attached to the hybrid integrated circuit 10, and the frame 20 is fitted thereon, thereby forming the hybrid integrated circuit 10 shown in FIG. 1, which integrally comprises the first male connector 12$a$.

After the assembly, an epoxy resin 38 is injected to a portion between the first male connector 12$a$ and the frame member 36$b$ through the hole defined by the recesses 32$a$ and 32$b$ so as to securely adhere the assembled first male connector 12$a$ to the hybrid integrated circuit 10 and to satisfactorily fix the soldering portions between the connecting pins 24$a$ and 24$b$ and the corresponding connecting terminals 22$g$ and 22$h$ while perfectly shielding the interior of the hybrid integrated circuit 10. Thus, the portion between the first male connector 12a and the frame member 36b is filled with the epoxy resin 38.

A portion between the frame member 36a and the side wall 18 is similarly filled with the epoxy resin 38 to protect the flexible circuit board 22f and to shield the interior of the hybrid integrated circuit 10 before the frame 20 is mounted.

As can be seen from the above description, the on the other end portion of the case-like hybrid integrated circuit 10 is integrally connected to the case-like integrated circuit 10 to have the connecting terminals 22i and 22j while a housing is defined by the projections 16c and 16d of the pair of lower and upper circuit boards 16a and 16b.

The second male connector 14b detachably connected to the second female connector 14a comprises a housing $14b_1$ whose distal end projects into a space sandwiched between the projections 16c and 16d, and a plurality of connecting pins $14b_2$ and $14b_3$ mounted in lines on the upper and lower portions of the housing $14b_1$ to be able to be in sliding contact with the connecting terminals 22i and 22j described above.

Note that the second male connector 14b is connected to a tuning device 44 as an external processing device (to be described later) through a connecting cord 42 as an external bus cable, as shown in FIG. 1.

Various electronic parts are mounted on the lower first circuit board 16a described above, as shown in FIG. 9.

Figure 9:
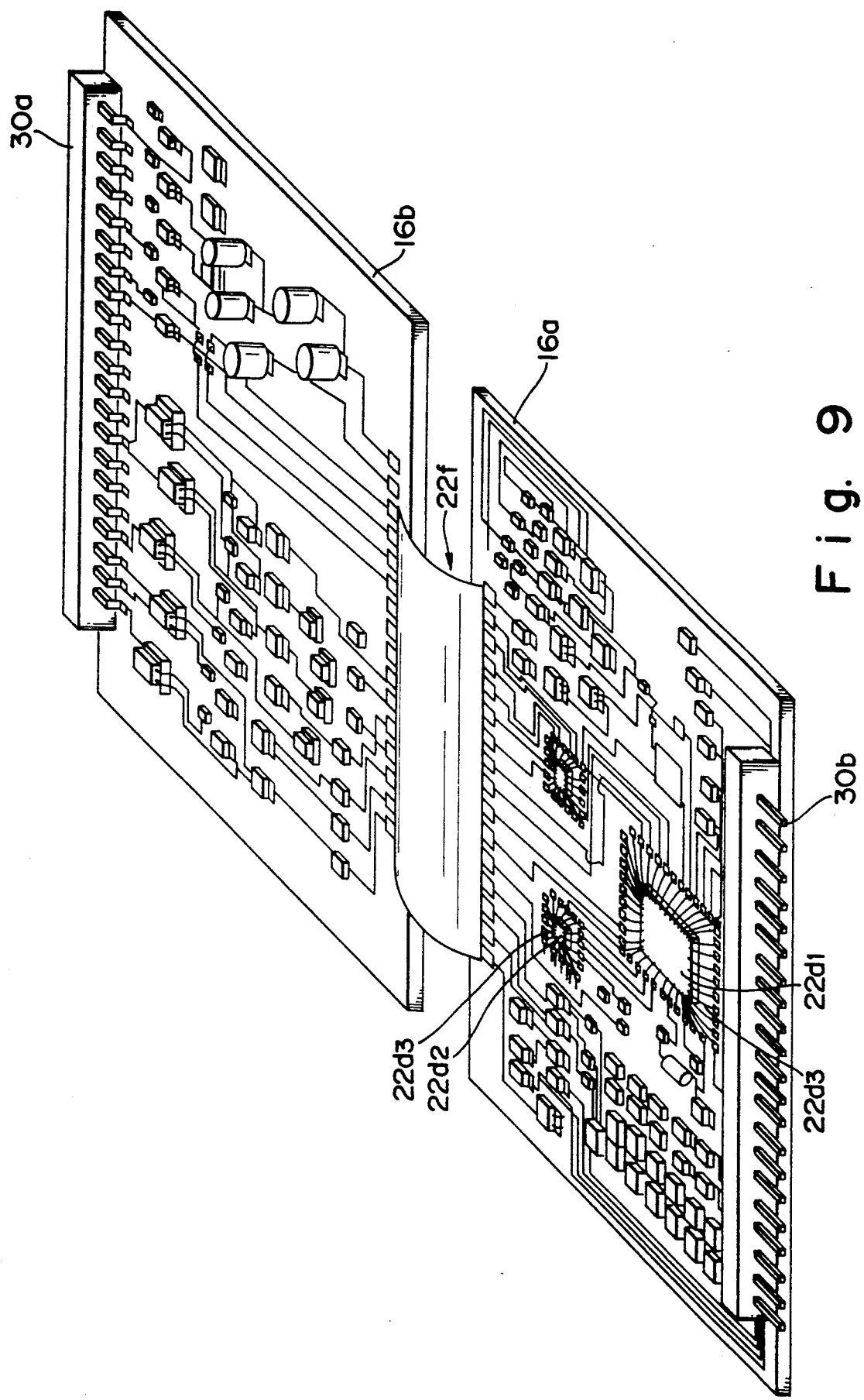
FIG. 9 is a schematic perspective view of a circuit element on a first circuit board.

More specifically, as shown in FIG. 9, a circuit network, in other words, a plurality of bus lines as a signal line group formed of the conductive layer 22c are formed on the insulating layer 22b of the first circuit board 16a to define a predetermined pattern. An IC chip $22d_1$ having a function equivalent to that of IC package having a function of a CPU necessary for providing the function of an engine control unit (e.g., MC6801 available from Motorola Inc.) is directly fixed as a bare chip on the insulating layer 22b of the first circuit board 16a. The CPU $22d_1$ is directly mounted on a predetermined group of the bus lines through corresponding bonding wires $22d_3$. Note that the IC chip $22d_1$ is connected to a ROM storing a predetermined control program, although not shown.

An IC chip $22d_2$ having a function equivalent to that of an IC package in which various data necessary for the CPU $22d_1$ to execute a control sequence (e.g., μPD28C64 available from NEC Corp.) is directly fixed as a bare chip on the insulating layer 22b of the first circuit board 16a. Note that the IC chip $22d_2$ serves as a nonvolatile programmable memory element, and is directly mounted on a predetermined group of the bus lines through corresponding bonding wires $22d_3$.

The memory element $22d_2$ is set up with and stores predetermined maps, default values, constants for defining threshold values, and the like. Although not shown, various circuit elements such as power transistors, gate circuit elements, voltage regulators, capacitors, resistors, and diodes are mounted on the second circuit board 16b.

Figure 10:
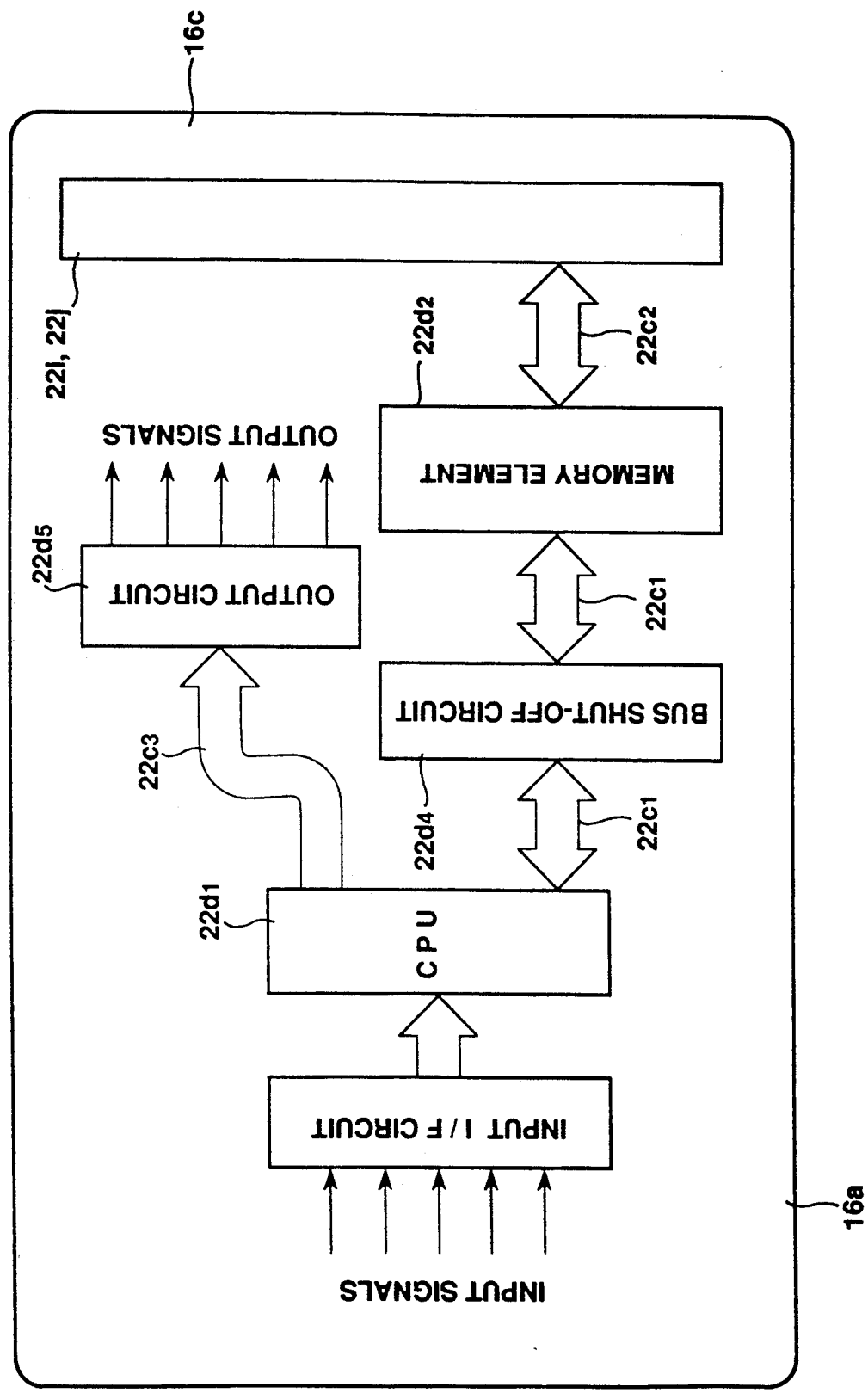
FIG. 10 is a block diagram showing a block arrangement of an ECU on the first circuit board shown in FIG. 9.

As shown in FIG. 10, the circuit network (circuit pattern) formed of the conductive layer 22c comprises a first bus line $22c_1$ for connecting the memory element $22d_2$ and the CPU $22d_1$ mounted as the bare chips, a second bus line $22c_2$ for connecting the memory element $22d_2$ and the plurality of connecting terminals 22i and 22j of the second female connector 12b, and a third bus line $22c_3$ for connecting the CPU $22d_1$ and the plurality of connecting terminals 22g and 22h of the first male connector 12a through an output circuit $22d_5$ via a circuit of various circuit elements.

Figure 11:
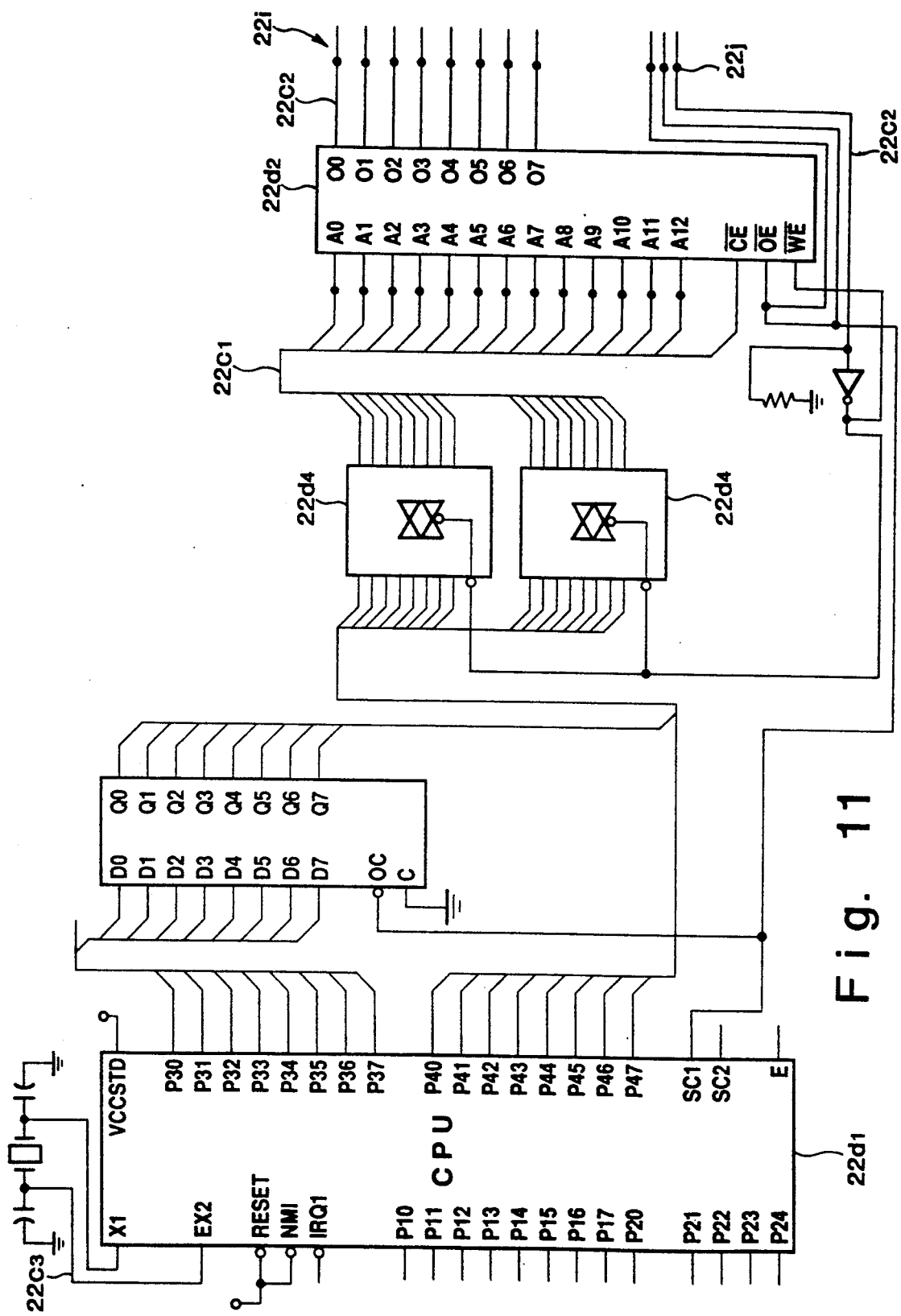
FIG. 11 is a detailed circuit diagram showing connections between a CPU on the first circuit board, and a memory element shown in FIG. 9.

A bus shut-off circuit $22d_4$ serving as a signal shut-off circuit is inserted in the conductive layer 22c as the circuit network for connecting the memory element $22d_2$ and the CPU $22d_1$, i.e., the second bus line $22c_1$, as shown in FIG. 11, so as to reliably prevent that when data in the memory element $22d_2$ is to be written, the rewrite data is transmitted to other circuit elements, and data in these circuit elements are unnecessarily rewritten. The bus shut-off circuit $22d_4$ comprises a conventionally known arrangement using a CMOS analog switch serving as a so-called tristate buffer, and a detailed description thereof will be omitted.

In the circuit arrangement on the first circuit board 16a described above, when data stored in the memory element $22d_2$ is to be rewritten during development, the second male connector 14b is connected shown in FIG. 5, and the tuning device 44 is set in a data rewrite mode, thereby rewriting data in the memory element $22d_2$.

The second female connector 14a comprises the connecting terminals 22i and 22j in correspondence with the connecting pins 24c and 24d of the second male connector 14b, as described above. As shown in FIG. 11, these connecting terminals 22j include a write mode setting connecting terminal connected, through an inverter, to the bonding wire $22d_3$ coupled to a write enable terminal WE of the memory element $22d_2$ through the second bus line $22c_2$, and a pair of write connecting terminals connected to the binding wires $22d_3$ respectively coupled to a chip enable terminal CE and an output enable terminal OE.

In a data rewrite mode, the second male connector 14b with the above-mentioned arrangement is connected to the female connector 12b, and data as a storage content stored in the memory element $22d_2$ is rewritten with desired data by the tuning device 44 which is connected to the integrated circuit 10 through the connecting cord 42.

In this rewrite operation, a high-level signal is supplied from the tuning device 44 to the write mode setting connecting terminal. As a result, a control terminal of the bus shut-off circuit $22d_4$ is set at low level, and an internal switch is opened in the bus shut-off circuit $22d_4$, thus setting the bus line in an open state. In this manner, rewrite data from the tuning device 44 can be reliably prevented by the bus shut-off circuit $22d_4$ from being transmitted to circuits other than the memory element $22d_2$.

When the high-level signal is output to the rewrite mode setting connecting terminal, the write enable terminal WE of the memory element $22d_2$ is set at low level. In addition, the tuning device 44 sets the chip enable terminal CE at high level, and the output enable terminal OE at low level through the pair of write connecting terminals. In this manner, a write state of the memory element $22d_2$ is set.

As described above, in the hybrid integrated circuit 10 of this embodiment, a nonvolatile programmable IC chip is employed as the memory element $22d_2$ for supplying predetermined data to the CPU $22d_1$, so that data stored in the memory element $22d_2$ can be arbitrarily rewritten. In this manner, even when data in the memory element $22d_2$ must be rewritten during development, a rewrite request can be easily satisfied, and a degree of freedom in development can be greatly improved.

In the data write operation, since the bus line for connecting the memory element 22$d_2$ and the CPU 22$_1$ is set in an open state by the bus shut-off circuit 22$d_4$, data rewrite information output from the tuning device 44 is not supplied to circuits other than the memory element 22$d_2$. Thus, data stored in the CPU 22$d_2$ and other circuit elements can be reliably prevented from being written by the data rewrite information.

In this embodiment, as described above, the data rewrite operation can be performed by simply connecting the second male connector 14$b$ to the second female connector to connect the integrated circuit 10 to the tuning device 44. Thus, the data rewrite operation can be easily performed by a very simple arrangement.

In this embodiment, when the control sequence of the integrated circuit 10 is to be simulated while the data stored in the memory element 22$d_2$ is rewritten, the tuning device 44 can be set in a simulation mode, so that the control sequence is simulated on the basis of data stored in the memory element 22$d_2$. When data stored in the memory element 22$d_2$ is to be monitored, the tuning device 44 is similarly set in a monitor mode to monitor the data. In this manner, setup (determination) of data to be stored in the memory element 22$d_2$ during development can be performed with a large degree of freedom.

When data to be stored in the memory element 22$d_2$ is determined after the development, the memory element 22$d_2$ is mounted on the insulating layer 22$b$ of the first circuit board 16$a$ as a bare chip in a state wherein such data is independently written in the memory element 22$d_2$. In this case, since the above-mentioned second female connector 14$a$ is determined to be in a non-use state, the above-mentioned synthetic resin is filled in the interior of the second female connector 14$a$, and the second female connector 14$a$ is entirely buried. In this manner, after the hybrid integrated circuit 10 is finished as a product, i.e., when it is delivered as a commercial product, the hybrid integrated circuit 10 has an outer appearance as if the second female connector 14$a$ were not present. As a result, an effect of preventing a decrease in product value can be achieved as compared to a case wherein the non-used second female connector 14$a$ constitutes part of an outer appearance.

Since the integrated circuit 10 of this embodiment is constituted, as described above, the second female connector 14$a$ and the second male connector 14$b$ are connected to each other to connect the integrated circuit 10 and the tuning device 44, so that the tuning device 44 can perform emulation of a control sequence of the CPU 22$d_1$ on the basis of data stored in the programmable memory element 22$d_2$, and can easily execute a tuning operation by rewriting, simulating, and monitoring data stored in the programmable memory element 22$d_2$.

In this manner, according to this embodiment, data to be stored in the memory element 22$d_2$ during development can be easily written, the control sequence of an operation of the CPU 22$d_1$ can be easily simulated based on the rewritten data, and the rewritten data can be easily monitored. Thus, the degree of freedom in development can be greatly improved.

In this embodiment, the circuit pattern of the bus lines 22$c_1$, 22$c2$, and 22$c_3$ used in development are directly employed to finish the integrated circuit 10 as a product. As a result, cost of etching a circuit pattern can be considerably reduced. Since a circuit pattern which is actually operated during development is applied to a product, the product can be operated as in the development without errors, and a stable operation of the product can be assured. In other words, reliability of the product can be guaranteed.

The present invention is not limited to the arrangement of the above embodiment, and various changes and modifications may be made within the spirit and scope of the invention.

In the above embodiment, the hybrid integrated circuit 10 having the function of the engine control unit has been exemplified. However, the present invention is not limited to this. For example, the integrated circuit 10 may serve as a functional component, e.g., an automatic vehicle velocity controller, a four-wheel steering controller, or an automatic transmission controller.

In the above embodiment, the hybrid integrated circuit 10 comprising the pair of upper and lower circuit boards 16$b$ and 16$a$ has been exemplified. However, the present invention is not limited to this structure. For example, the integrated circuit 10 may comprise three parallel circuit boards.

In the above embodiment, an object to be simulated, monitored, or data-rewritten by the tuning device 44 is the memory element 22$d_2$ storing data. However, the present invention is not limited to this. For example, the present invention can be similarly applied to a case wherein a control program of an IC chip as the CPU 22$d_1$ is externally processed.

In the above embodiment, a device to be connected through the connecting cord 42 is the tuning device 44. However, the present invention is not limited to this arrangement. For example, an emulator may be connected, and the control content of the integrated circuit 10 may be emulated by this emulator.

In the above embodiment, the CPU 22$d_1$ and the memory element 22$d_2$ as circuit elements are directly mounted on the insulating layer 22 as bare chips. However, the present invention is not limited to this arrangement. For example, the present invention can be similarly applied to a case wherein the CPU 22$d_1$ and the memory element 22$d_2$ as circuit elements may comprise package type ICs, and may be nondetachably mounted on predetermined bus line by soldering.

In the above embodiment, when the development of the integrated circuit 10 is finished and data to be stored in the memory element 22$d_2$ is determined, the above-mentioned synthetic resin is injected into the second female connector 14$a$, and the second female connector 14$a$ is entirely buried. However, the present invention is not limited to this structure. For example, the second female connector 14$a$ may be maintained in a state to be usable later without being buried with a synthetic resin. When the second female connector 14$a$ is mounted on a vehicle in a usable state, the control content of the CPU 22$d_1$ can be rewritten later even if the integrated circuit 10 undergoes updating of version and the control content of the CPU 22$d_1$ is changed. Thus, updating of the version of the integrated circuit 10 can be easily attained. Even when the control operation of the integrated circuit 10 is abnormally performed and its control and storage contents must be checked, they can be easily checked through this second female connector 14$a$.

As many apparently widely different embodiments of the present invention can be made without departing from the spirit and scope thereof, it is to be understood that the invention is not limited to the specific embodiments thereof except as defined in the appended claims.

What is claimed is:

1. An integral circuit having a metal substrate, comprising:
   a first circuit board in which a conductive layer of desired pattern is formed on said metal substrate through an insulating layer;
   a memory device nondetachably mounted on said first circuit board and storing nonvolatile data which can be rewritten by an external operation;
   a controlling device mounted on said first circuit board and connected to said memory device and performing a predetermined controlling operation based on the nonvolatile data stored in said memory device;
   a first connector, mounted on said first circuit board, and having a first group of terminals connected to a first path for passing control signals from said controlling device to an external object which will be electrically controlled by said controlling device;
   a second connector, mounted on said first circuit board, arranged separately from said first connector and externally accessible, and having a second group of terminals connected to a detachable second path, for passing signals to rewrite the nonvolatile data in said memory device responsive to the external operation performed by an external processing device via the second path which is different from the first path in said first connector, said second connector having a female-connector shape so that said second connector can be sealed by filling a resin after rewriting of the nonvolatile data stored in said memory device; and
   seal means for sealing an outer surface of said first circuit board except said first and second connectors so that said first and second connectors are exposed to the outside.

2. The integrated circuit according to claim 1, wherein said conductive layer includes a first signal line group for connecting said memory device to another circuit element, and a second signal line group for connecting said memory device to said second connector, and
   signal shut-off means for stopping data transmission to said another circuit element when the storage content of said memory device to be written is arranged at a position of said first signal line group and adjacent to said memory device.

3. The integrated circuit according to claim 1, wherein said second connector is mounted on a portion to be mounted for connection to said external processing device.

4. The integrated circuit according to claim 1, wherein said external processing device comprises a tuning device for changing a controlling manner of said controlling device by rewriting the storage content of said memory device.

5. The integrated circuit according to claim 1, wherein said external processing device comprises a tuning device for monitoring the storage content of said memory device.

6. The integrated circuit according to claim 1, wherein said controlling device connects to said external processing device through said second connector means.

7. The integrated circuit according to claim 6, wherein said external processing device comprises a tuning device for rewriting a control content of said controlling device.

8. The integrated circuit according to claim 6, wherein said external processing device comprises an emulator for emulating a control content of said controlling device.

9. The integrated circuit according to claim 1, wherein said first connector comprises a first male connector integrally mounted on one end of said integrated circuit, and a first female connector detachably attached to said first male connector, and connected to said external object to be controlled.

10. The integrated circuit according to claim 1, wherein said second connector comprises a second female connector integrally mounted on another end of said integrated circuit, and a second male connector detachably attached to said second female connector, and connected to said external processing device.

11. The integrated circuit according to claim 1, wherein said first and second connectors are arranged at both ends of said first circuit board, opposing each other.

12. The integrated circuit according to claim 1, wherein said seal means includes:
   a second circuit board arranged to oppose said first circuit board; and
   a pair of seal members for sealing both sides of said first circuit board and said second circuit board; and
   wherein said second connector is formed to have an opening portion surrounded by an inner surface of said first circuit board, an inner surface of said second circuit board and inner surfaces of said pair of seal members, so that said second connector has a female-connector shape.

13. The integrated circuit according to claim 12, wherein connecting terminals for said second connector are arranged on the respective inner surfaces of said first circuit board and said second circuit board.

* * * * *

UNITED STATES PATENT AND TRADEMARK OFFICE
CERTIFICATE OF CORRECTION

PATENT NO. : 5,274,570
DATED : December 28, 1993
INVENTOR(S) : IZUMI et al.

It is certified that error appears in the above-indentified patent and that said Letters Patent is hereby corrected as shown below:

Column 9, line 8, after "description, the", insert --second female connector 14a which is integrally formed--.

Column 10, line 19, after "connected" insert --to the corresponding second female connector 14a,--.

Column 11, line 63, "22c2" should be $22c_2$

Signed and Sealed this

Twenty-fifth Day of July, 1995

Attest:

BRUCE LEHMAN

Attesting Officer

Commissioner of Patents and Trademarks